(12) United States Patent
Dunn et al.

(10) Patent No.: US 10,524,397 B2
(45) Date of Patent: *Dec. 31, 2019

(54) HEAT EXCHANGER ASSEMBLY FOR AN ELECTRONIC DISPLAY

(71) Applicant: Manufacturing Resources International, Inc., Alpharetta, GA (US)

(72) Inventors: William Dunn, Alpharetta, GA (US);
Tim Hubbard, Alpharetta, GA (US);
Kevin O'Connor, Duluth, GA (US)

(73) Assignee: Manufacturing Resources International, Inc., Alpharetta, GA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/589,932

(22) Filed: May 8, 2017

(65) Prior Publication Data

US 2017/0245400 A1 Aug. 24, 2017

Related U.S. Application Data

(63) Continuation of application No. 14/198,141, filed on Mar. 5, 2014, now Pat. No. 9,648,790.
(Continued)

(51) Int. Cl.
*H05K 7/20* (2006.01)
*G11B 33/06* (2006.01)

(52) U.S. Cl.
CPC ........ *H05K 7/20909* (2013.01); *G11B 33/06* (2013.01); *H05K 7/202* (2013.01);
(Continued)

(58) Field of Classification Search
CPC .......... H05K 7/20145; H05K 7/20909; H05K 7/20918; H05K 7/202; G11B 33/06
(Continued)

(56) References Cited

U.S. PATENT DOCUMENTS

| 4,093,355 A | 6/1978 | Kaplit et al. |
| 4,593,978 A | 6/1986 | Mourey et al. |

(Continued)

FOREIGN PATENT DOCUMENTS

| AU | 2011248190 B2 | 5/2011 |
| CN | 2702363 Y | 5/2005 |

(Continued)

OTHER PUBLICATIONS

ITSENCLOSURES, Product Catalog, 2009, 48 pages.
(Continued)

*Primary Examiner* — Mukundbhai G Patel
(74) *Attorney, Agent, or Firm* — Standley Law Group LLP; Jeffrey S. Standley; Eric M. Gayan

(57) ABSTRACT

The exemplary embodiments disclosed herein are directed to a heat exchanger assembly for cooling power module bricks, the heat exchanger assembly having a plurality of spaced apart heat exchanger layers between which external air and a closed loop gas are separately circulated. A series of metallic plates may be located within the spaces between some or all of the heat exchanger layers to conduct heat from the power modules. Circulating fans may be employed to circulate external air and circulating gas through the heat exchanger. Pass through junctions may be positioned near edges of the heat exchanger to permit the circulating gas to cross paths with the external air without allowing the two gas flows to mix with one another.

20 Claims, 6 Drawing Sheets

Related U.S. Application Data

(60) Provisional application No. 61/791,421, filed on Mar. 15, 2013.

(52) U.S. Cl.
CPC ......... *H05K 7/209* (2013.01); *H05K 7/20145* (2013.01); *H05K 7/20972* (2013.01); *H05K 7/20* (2013.01)

(58) Field of Classification Search
USPC ....................................................... 361/695
See application file for complete search history.

(56) References Cited

U.S. PATENT DOCUMENTS

| | | |
|---|---|---|
| 4,634,225 A | 1/1987 | Haim et al. |
| 4,748,765 A | 6/1988 | Martin |
| 4,763,993 A | 8/1988 | Vogeley et al. |
| 4,921,041 A | 5/1990 | Akachi |
| 4,952,783 A | 8/1990 | Aufderheide et al. |
| 4,952,925 A | 8/1990 | Haastert |
| 5,029,982 A | 7/1991 | Nash |
| 5,088,806 A | 2/1992 | McCartney et al. |
| 5,247,374 A | 9/1993 | Terada |
| 5,282,114 A | 1/1994 | Stone |
| 5,293,930 A | 3/1994 | Pitasi |
| 5,432,526 A | 7/1995 | Hyatt |
| 5,535,816 A * | 7/1996 | Ishida ............... F28F 3/02 165/104.33 |
| 5,559,614 A | 9/1996 | Urbish et al. |
| 5,621,614 A | 4/1997 | O'Neill |
| 5,657,641 A | 8/1997 | Cunningham et al. |
| 5,748,269 A | 5/1998 | Harris et al. |
| 5,765,743 A | 6/1998 | Sakiura et al. |
| 5,767,489 A | 6/1998 | Ferrier |
| 5,808,418 A | 9/1998 | Pitman et al. |
| 5,818,010 A | 10/1998 | McCann |
| 5,818,694 A | 10/1998 | Daikoku et al. |
| 5,835,179 A | 11/1998 | Yamanaka |
| 5,864,465 A | 1/1999 | Liu |
| 5,869,818 A | 2/1999 | Kim |
| 5,869,919 A | 2/1999 | Sato et al. |
| 5,903,433 A | 5/1999 | Gudmundsson |
| 5,991,153 A | 11/1999 | Heady et al. |
| 6,003,015 A | 12/1999 | Kang et al. |
| 6,007,205 A | 12/1999 | Fujimori |
| 6,043,979 A | 3/2000 | Shim |
| 6,089,751 A | 7/2000 | Conover et al. |
| 6,104,451 A | 8/2000 | Matsuoka et al. |
| 6,157,432 A | 12/2000 | Helbing |
| 6,181,070 B1 | 1/2001 | Dunn et al. |
| 6,191,839 B1 | 2/2001 | Briley et al. |
| 6,198,222 B1 | 3/2001 | Chang |
| 6,211,934 B1 | 4/2001 | Habing et al. |
| 6,215,655 B1 | 4/2001 | Heady et al. |
| 6,351,381 B1 | 2/2002 | Bilski et al. |
| 6,392,727 B1 | 5/2002 | Larson et al. |
| 6,417,900 B1 | 7/2002 | Shin et al. |
| 6,428,198 B1 | 8/2002 | Saccomanno et al. |
| 6,473,150 B1 | 10/2002 | Takushima et al. |
| 6,476,883 B1 | 11/2002 | Salimes et al. |
| 6,493,440 B2 | 12/2002 | Gromatsky et al. |
| 6,504,713 B1 | 1/2003 | Pandolfi et al. |
| 6,535,266 B1 | 3/2003 | Nemeth et al. |
| 6,628,355 B1 | 9/2003 | Takahara |
| 6,701,143 B1 | 3/2004 | Dukach et al. |
| 6,714,410 B2 | 3/2004 | Wellhofer |
| 6,727,468 B1 | 4/2004 | Nemeth |
| 6,742,583 B2 | 6/2004 | Tikka |
| 6,812,851 B1 | 11/2004 | Dukach et al. |
| 6,825,828 B2 | 11/2004 | Burke et al. |
| 6,839,104 B2 | 1/2005 | Taniguchi et al. |
| 6,850,209 B2 | 2/2005 | Mankins et al. |
| 6,885,412 B2 | 4/2005 | Ohnishi et al. |
| 6,886,942 B2 | 5/2005 | Okada et al. |
| 6,891,135 B2 | 5/2005 | Pala et al. |
| 6,909,486 B2 | 6/2005 | Wang et al. |
| 6,943,768 B2 | 9/2005 | Cavanaugh et al. |
| 6,961,108 B2 | 11/2005 | Wang et al. |
| 7,015,470 B2 | 3/2006 | Faytlin et al. |
| 7,059,757 B2 | 6/2006 | Shimizu |
| 7,083,285 B2 | 8/2006 | Hsu et al. |
| 7,157,838 B2 | 1/2007 | Thielemans et al. |
| 7,161,803 B1 | 1/2007 | Heady |
| 7,190,587 B2 | 3/2007 | Kim et al. |
| 7,209,349 B2 | 4/2007 | Chien et al. |
| 7,212,403 B2 | 5/2007 | Rockenfell |
| 7,259,964 B2 | 8/2007 | Yamamura et al. |
| 7,269,023 B2 | 9/2007 | Nagano |
| 7,284,874 B2 | 10/2007 | Jeong et al. |
| 7,452,121 B2 | 11/2008 | Cho et al. |
| 7,457,113 B2 | 11/2008 | Kumhyr et al. |
| 7,480,140 B2 | 1/2009 | Hara et al. |
| 7,535,543 B2 | 5/2009 | Dewa et al. |
| 7,591,508 B2 | 9/2009 | Chang |
| 7,602,469 B2 | 10/2009 | Shin |
| D608,775 S | 1/2010 | Leung |
| 7,667,964 B2 | 2/2010 | Kang et al. |
| 7,682,047 B2 | 3/2010 | Hsu et al. |
| 7,752,858 B2 | 7/2010 | Johnson et al. |
| 7,753,567 B2 | 7/2010 | Kang et al. |
| 7,762,707 B2 | 7/2010 | Kim et al. |
| 7,800,706 B2 | 9/2010 | Kim et al. |
| 7,813,124 B2 | 10/2010 | Karppanen |
| 7,903,416 B2 | 3/2011 | Chou |
| 7,995,342 B2 | 8/2011 | Nakamichi et al. |
| 8,004,648 B2 | 8/2011 | Dunn |
| 8,035,968 B2 | 10/2011 | Kwon et al. |
| 8,081,465 B2 | 12/2011 | Nishiura |
| 8,102,173 B2 | 1/2012 | Merrow |
| 8,142,027 B2 | 3/2012 | Sakai |
| 8,208,115 B2 | 6/2012 | Dunn |
| 8,223,311 B2 | 7/2012 | Kim et al. |
| 8,241,573 B2 | 8/2012 | Banerjee et al. |
| 8,248,784 B2 | 8/2012 | Nakamichi et al. |
| 8,254,121 B2 | 8/2012 | Lee et al. |
| 8,269,916 B2 | 9/2012 | Ohkawa |
| 8,270,163 B2 | 9/2012 | Nakamichi et al. |
| 8,274,622 B2 | 9/2012 | Dunn |
| 8,274,789 B2 | 9/2012 | Nakamichi et al. |
| 8,300,203 B2 | 10/2012 | Nakamichi et al. |
| 8,320,119 B2 | 11/2012 | Isoshima et al. |
| 8,351,014 B2 | 1/2013 | Dunn |
| 8,358,397 B2 | 1/2013 | Dunn |
| 8,369,083 B2 | 2/2013 | Dunn et al. |
| 8,373,841 B2 | 2/2013 | Dunn |
| 8,379,182 B2 | 2/2013 | Dunn |
| 8,400,608 B2 | 3/2013 | Takahashi et al. |
| 8,472,174 B2 | 6/2013 | Idems et al. |
| 8,472,191 B2 | 6/2013 | Yamamoto et al. |
| 8,482,695 B2 | 7/2013 | Dunn |
| 8,497,972 B2 | 7/2013 | Dunn et al. |
| 8,590,602 B2 | 11/2013 | Fernandez |
| 8,649,170 B2 | 2/2014 | Dunn et al. |
| 8,649,176 B2 | 2/2014 | Okada et al. |
| 8,654,302 B2 | 2/2014 | Dunn et al. |
| 8,678,603 B2 | 3/2014 | Zhang |
| 8,693,185 B2 | 4/2014 | Dunn et al. |
| 8,700,226 B2 | 4/2014 | Schuch et al. |
| 8,711,321 B2 | 4/2014 | Dunn et al. |
| 8,749,749 B2 | 6/2014 | Hubbard |
| 8,755,021 B2 | 6/2014 | Hubbard |
| 8,758,144 B2 | 6/2014 | Williams et al. |
| 8,760,613 B2 | 6/2014 | Dunn |
| 8,767,165 B2 | 7/2014 | Dunn |
| 8,773,633 B2 | 7/2014 | Dunn et al. |
| 8,804,091 B2 | 8/2014 | Dunn et al. |
| 8,823,916 B2 | 9/2014 | Hubbard et al. |
| 8,854,572 B2 | 10/2014 | Dunn |
| 8,854,595 B2 | 10/2014 | Dunn |
| 8,879,042 B2 | 11/2014 | Dunn |
| 8,988,647 B2 | 3/2015 | Hubbard |
| 9,030,641 B2 | 5/2015 | Dunn |
| 9,089,079 B2 | 7/2015 | Dunn |

(56) References Cited

U.S. PATENT DOCUMENTS

| | | |
|---|---|---|
| 9,119,325 B2 | 8/2015 | Dunn et al. |
| 9,119,330 B2 | 8/2015 | Hubbard et al. |
| 9,173,322 B2 | 10/2015 | Dunn |
| 9,173,325 B2 | 10/2015 | Dunn |
| 9,282,676 B1 | 3/2016 | Diaz |
| 9,285,108 B2 | 3/2016 | Dunn et al. |
| 9,313,917 B2 | 4/2016 | Dunn et al. |
| 9,370,127 B2 | 6/2016 | Dunn |
| 9,448,569 B2 | 9/2016 | Schuch et al. |
| 9,451,060 B1 | 9/2016 | Bowers et al. |
| 9,451,733 B2 | 9/2016 | Dunn et al. |
| 9,456,525 B2 | 9/2016 | Yoon et al. |
| 9,470,924 B2 | 10/2016 | Dunn et al. |
| 9,500,896 B2 | 11/2016 | Dunn et al. |
| 9,516,485 B1 | 12/2016 | Bowers et al. |
| 9,549,490 B2 | 1/2017 | Hubbard |
| 9,594,271 B2 | 3/2017 | Dunn et al. |
| 9,613,548 B2 | 4/2017 | DeMars |
| 9,622,392 B1 | 4/2017 | Bowers et al. |
| 9,629,287 B2 | 4/2017 | Dunn |
| 9,648,790 B2 * | 5/2017 | Dunn ............... H05K 7/20909 |
| 9,655,289 B2 | 5/2017 | Dunn et al. |
| 9,723,765 B2 | 8/2017 | DeMars |
| 9,894,800 B2 | 2/2018 | Dunn |
| 2001/0001459 A1 | 5/2001 | Savant et al. |
| 2001/0019454 A1 | 9/2001 | Tadic-Galeb et al. |
| 2002/0009978 A1 | 1/2002 | Dukach et al. |
| 2002/0033919 A1 | 3/2002 | Sanelle et al. |
| 2002/0065046 A1 | 5/2002 | Mankins et al. |
| 2002/0084891 A1 | 7/2002 | Mankins et al. |
| 2002/0101553 A1 | 8/2002 | Enomoto et al. |
| 2002/0126248 A1 | 9/2002 | Yoshia |
| 2002/0148600 A1 | 10/2002 | Bosch et al. |
| 2002/0149714 A1 | 10/2002 | Anderson et al. |
| 2002/0154255 A1 | 10/2002 | Gromatzky et al. |
| 2002/0164944 A1 | 11/2002 | Haglid |
| 2002/0164962 A1 | 11/2002 | Mankins et al. |
| 2002/0167637 A1 | 11/2002 | Burke et al. |
| 2003/0007109 A1 | 1/2003 | Park |
| 2003/0020884 A1 | 1/2003 | Okada et al. |
| 2003/0043091 A1 | 3/2003 | Takeuchi et al. |
| 2003/0104210 A1 | 6/2003 | Azumi et al. |
| 2003/0128511 A1 | 7/2003 | Nagashima et al. |
| 2003/0214785 A1 | 11/2003 | Perazzo |
| 2004/0012722 A1 | 1/2004 | Alvarez |
| 2004/0035558 A1 | 2/2004 | Todd et al. |
| 2004/0036834 A1 | 2/2004 | Ohnishi et al. |
| 2004/0042174 A1 | 3/2004 | Tomioka et al. |
| 2004/0103570 A1 | 6/2004 | Ruttenberg |
| 2004/0105159 A1 | 6/2004 | Saccomanno et al. |
| 2004/0165139 A1 | 8/2004 | Anderson et al. |
| 2004/0223299 A1 | 11/2004 | Ghosh |
| 2005/0012039 A1 | 1/2005 | Faytlin et al. |
| 2005/0012722 A1 | 1/2005 | Chon |
| 2005/0062373 A1 | 3/2005 | Kim et al. |
| 2005/0073632 A1 | 4/2005 | Dunn et al. |
| 2005/0073639 A1 | 4/2005 | Pan |
| 2005/0127796 A1 | 6/2005 | Olesen et al. |
| 2005/0134525 A1 | 6/2005 | Tanghe et al. |
| 2005/0134526 A1 | 6/2005 | Willem et al. |
| 2005/0213950 A1 | 9/2005 | Yoshimura |
| 2005/0229630 A1 | 10/2005 | Richter et al. |
| 2005/0237714 A1 | 10/2005 | Ebermann |
| 2005/0276053 A1 | 12/2005 | Nortrup et al. |
| 2005/0286131 A1 | 12/2005 | Saxena et al. |
| 2006/0012958 A1 | 1/2006 | Tomioka et al. |
| 2006/0018093 A1 | 1/2006 | Lai et al. |
| 2006/0034051 A1 | 2/2006 | Wang et al. |
| 2006/0056994 A1 | 3/2006 | Van Lear et al. |
| 2006/0082271 A1 | 4/2006 | Lee et al. |
| 2006/0092348 A1 | 5/2006 | Park |
| 2006/0125998 A1 | 6/2006 | Dewa et al. |
| 2006/0132699 A1 | 6/2006 | Cho et al. |
| 2006/0177587 A1 | 8/2006 | Ishizuka et al. |
| 2006/0199514 A1 | 9/2006 | Kimura |
| 2006/0209266 A1 | 9/2006 | Utsunomiya |
| 2006/0260790 A1 | 11/2006 | Theno et al. |
| 2006/0262079 A1 | 11/2006 | Seong et al. |
| 2006/0266499 A1 | 11/2006 | Choi et al. |
| 2006/0283579 A1 | 12/2006 | Ghosh et al. |
| 2007/0019419 A1 | 1/2007 | Hafuka et al. |
| 2007/0030879 A1 | 2/2007 | Hatta |
| 2007/0047239 A1 | 3/2007 | Kang et al. |
| 2007/0065091 A1 | 3/2007 | Hinata et al. |
| 2007/0076431 A1 | 4/2007 | Atarashi et al. |
| 2007/0081344 A1 | 4/2007 | Cappaert et al. |
| 2007/0103863 A1 | 5/2007 | Kim |
| 2007/0103866 A1 | 5/2007 | Park |
| 2007/0115686 A1 | 5/2007 | Tyberghien |
| 2007/0139929 A1 | 6/2007 | Yoo et al. |
| 2007/0140671 A1 | 6/2007 | Yoshimura |
| 2007/0151274 A1 | 7/2007 | Roche et al. |
| 2007/0151664 A1 | 7/2007 | Shin |
| 2007/0171353 A1 | 7/2007 | Hong |
| 2007/0206158 A1 | 9/2007 | Kinoshita et al. |
| 2007/0211205 A1 | 9/2007 | Shibata |
| 2007/0212211 A1 | 9/2007 | Chiyoda et al. |
| 2007/0217221 A1 | 9/2007 | Lee et al. |
| 2007/0237636 A1 | 10/2007 | Hsu |
| 2007/0267174 A1 | 11/2007 | Kim |
| 2008/0055534 A1 | 3/2008 | Kawano |
| 2008/0076342 A1 | 3/2008 | Bryant et al. |
| 2008/0099193 A1 | 5/2008 | Aksamit et al. |
| 2008/0148609 A1 | 6/2008 | Ogoreve |
| 2008/0209934 A1 | 9/2008 | Richards |
| 2008/0218446 A1 | 9/2008 | Yamanaka |
| 2008/0236005 A1 | 10/2008 | Isayev et al. |
| 2008/0267790 A1 | 10/2008 | Gaudet et al. |
| 2008/0283234 A1 | 11/2008 | Sagi et al. |
| 2008/0285290 A1 | 11/2008 | Ohashi et al. |
| 2009/0009047 A1 | 1/2009 | Yanagawa et al. |
| 2009/0009729 A1 | 1/2009 | Sakai |
| 2009/0059518 A1 | 3/2009 | Kakikawa et al. |
| 2009/0086430 A1 | 4/2009 | Kang et al. |
| 2009/0120629 A1 | 5/2009 | Ashe |
| 2009/0122218 A1 | 5/2009 | Oh et al. |
| 2009/0126906 A1 | 5/2009 | Dunn |
| 2009/0126907 A1 | 5/2009 | Dunn |
| 2009/0126914 A1 | 5/2009 | Dunn |
| 2009/0135365 A1 | 5/2009 | Dunn |
| 2009/0147170 A1 | 6/2009 | Oh et al. |
| 2009/0154096 A1 | 6/2009 | Iyengar et al. |
| 2009/0174626 A1 | 7/2009 | Isoshima et al. |
| 2009/0231807 A1 | 9/2009 | Bouissier |
| 2009/0244472 A1 | 10/2009 | Dunn |
| 2009/0279240 A1 | 11/2009 | Karppanen |
| 2009/0302727 A1 | 12/2009 | Vincent et al. |
| 2009/0306820 A1 | 12/2009 | Simmons et al. |
| 2010/0060861 A1 | 3/2010 | Medin |
| 2010/0079949 A1 | 4/2010 | Nakamichi et al. |
| 2010/0162747 A1 | 7/2010 | Hamel et al. |
| 2010/0171889 A1 | 7/2010 | Pantel et al. |
| 2010/0182562 A1 | 7/2010 | Yoshida et al. |
| 2010/0220249 A1 | 9/2010 | Nakamichi et al. |
| 2010/0226091 A1 | 9/2010 | Dunn |
| 2010/0232107 A1 | 9/2010 | Dunn |
| 2010/0238394 A1 | 9/2010 | Dunn |
| 2010/0321887 A1 | 12/2010 | Kwon et al. |
| 2011/0001898 A1 | 1/2011 | Mikubo et al. |
| 2011/0013114 A1 | 1/2011 | Dunn et al. |
| 2011/0019363 A1 | 1/2011 | Vahlsing et al. |
| 2011/0051071 A1 | 3/2011 | Nakamichi et al. |
| 2011/0058326 A1 | 3/2011 | Idems et al. |
| 2011/0075361 A1 | 3/2011 | Nakamichi et al. |
| 2011/0083460 A1 | 4/2011 | Thomas et al. |
| 2011/0083824 A1 | 4/2011 | Rogers |
| 2011/0085301 A1 | 4/2011 | Dunn |
| 2011/0085302 A1 | 4/2011 | Nakamichi et al. |
| 2011/0114384 A1 | 5/2011 | Sakamoto et al. |
| 2011/0116000 A1 | 5/2011 | Dunn et al. |
| 2011/0122162 A1 | 5/2011 | Sato et al. |
| 2011/0141724 A1 | 6/2011 | Erion |
| 2011/0261523 A1 * | 10/2011 | Dunn ............... G02F 1/133308 |
| | | 361/679.21 |

(56) References Cited

U.S. PATENT DOCUMENTS

| | | |
|---|---|---|
| 2012/0006523 A1 | 1/2012 | Masahiro et al. |
| 2012/0012295 A1 | 1/2012 | Kakiuchi et al. |
| 2012/0012300 A1* | 1/2012 | Dunn ............... G02F 1/133385 |
| | | 165/287 |
| 2012/0014063 A1 | 1/2012 | Weiss |
| 2012/0020114 A1 | 1/2012 | Miyamoto et al. |
| 2012/0038849 A1 | 2/2012 | Dunn et al. |
| 2012/0044217 A1 | 2/2012 | Okada et al. |
| 2012/0106081 A1 | 5/2012 | Hubbard et al. |
| 2012/0188481 A1 | 7/2012 | Kang et al. |
| 2012/0206687 A1 | 8/2012 | Dunn et al. |
| 2012/0249402 A1 | 10/2012 | Kang |
| 2012/0255704 A1 | 10/2012 | Nakamichi |
| 2012/0274876 A1 | 11/2012 | Cappaert et al. |
| 2012/0284547 A1 | 11/2012 | Culbert et al. |

FOREIGN PATENT DOCUMENTS

| | | |
|---|---|---|
| EP | 1408476 A1 | 4/2004 |
| EP | 1647766 A2 | 4/2006 |
| EP | 1762892 A1 | 3/2007 |
| EP | 1951020 A1 | 7/2008 |
| EP | 2225603 A2 | 9/2010 |
| EP | 2370987 A2 | 10/2011 |
| GB | 2402205 A | 12/2004 |
| JP | 402062015 A | 3/1990 |
| JP | 402307080 A | 12/1990 |
| JP | 3153212 A | 7/1991 |
| JP | H062337 U | 1/1994 |
| JP | 6082745 A | 3/1994 |
| JP | 8115788 A | 5/1996 |
| JP | 8194437 A | 7/1996 |
| JP | H08305301 A | 11/1996 |
| JP | 8339034 A | 12/1996 |
| JP | H09246766 A | 9/1997 |
| JP | 1160727 A | 6/1999 |
| JP | H11296094 A | 10/1999 |
| JP | 2001209126 A | 8/2001 |
| JP | 2002158475 A | 5/2002 |
| JP | 2004053749 A | 2/2004 |
| JP | 2004286940 A | 10/2004 |
| JP | 2005017556 A | 1/2005 |
| JP | 2000131682 A | 5/2005 |
| JP | 2005134849 A | 5/2005 |
| JP | 2005265922 A | 9/2005 |
| JP | 2006513577 A | 4/2006 |
| JP | 2007322718 A | 5/2006 |
| JP | 2006148047 A | 6/2006 |
| JP | 2006163217 A | 6/2006 |
| JP | 2007003638 A | 1/2007 |
| JP | 09307257 A | 11/2007 |
| JP | 2007293105 A | 11/2007 |
| JP | 2008010361 A | 1/2008 |
| JP | 2008292743 A | 12/2008 |
| JP | 2010024624 A | 2/2010 |
| JP | 2010-102227 A | 5/2010 |
| JP | 2010282109 A | 12/2010 |
| JP | 2011-75819 A | 4/2011 |
| JP | 2012-133254 A | 7/2012 |
| KR | 20000000118 U | 1/2000 |
| KR | 20000047899 A | 7/2000 |
| KR | 200366674 Y1 | 11/2004 |
| KR | 20050033986 A | 4/2005 |
| KR | 200401354 Y1 | 11/2005 |
| KR | 20060016469 A | 2/2006 |
| KR | 100666961 B1 | 1/2007 |
| KR | 1020070070675 A | 4/2007 |
| KR | 1020070048294 | 8/2007 |
| WO | 2005079129 A1 | 8/2005 |
| WO | WO2007116116 A1 | 10/2007 |
| WO | WO2008050660 A2 | 5/2008 |
| WO | WO2009065125 A2 | 5/2009 |
| WO | WO2009065125 A3 | 5/2009 |
| WO | WO2009135308 A1 | 11/2009 |
| WO | WO2010007821 A1 | 2/2010 |
| WO | WO2010080624 A2 | 7/2010 |
| WO | WO2011069084 A3 | 6/2011 |
| WO | WO2011072217 A3 | 6/2011 |
| WO | WO2011140179 A1 | 11/2011 |
| WO | WO2011150078 A2 | 12/2011 |
| WO | WO2012021573 A2 | 2/2012 |
| WO | WO2012024426 A3 | 2/2012 |

OTHER PUBLICATIONS

ITSENCLOSURES, Standard Product Data Sheet, 2011, 18 pages.
SUNBRITETV, All Weather Outdoor LCD Television Model 4610HD, 2008, 1 page.
SUNBRITETV, Introduces Two New All-Weather Outdoor Televisions InfoComm 2008, 7 pages.
Zeeff, T.M., EMC analysis of an 18" LCD monitor, 2000, 1 page.
Novitsky, Driving LEDs versus CCFLs for LCD backlighting, Nov. 12, 2007, 6 pages.
Federman, Cooling Flat Panel Displays, 2011, 4 pages.
*Civiq Smartscapes, LLC V. Manufacturing Resources International, Inc.*, Memorandum Opinion re claim construction, Sep. 27, 2018, 16 pages.
*Civiq Smartscapes, LLC V. Manufacturing Resources International, Inc.*, Claim Construction Drder, Oct. 3, 2018, 2 pages.
Mentley, David E., State of Flat-Panel Display Technology and Future Trends, Proceedings of the IEEE, Apr. 2002, vol. 90, No. 4, pp. 453-459.
CIVIQ, Invalidity Claim Chart, Appendix I, Mar. 22, 2018, 4 pages.
CIVIQ, Invalidity Contentions, Jan. 24, 2018, 51 pages.
CIVIQ, Invalidity Claim Charts, Appendix A—Appendix D, Jan. 24, 2018, 51 pages.
Bureau of Ships Navy Department, Guide Manual of Cooling methods for Electronic Equipment, Mar. 31, 1955, 212 pages.
Wankhede, Evaluation of Cooling Solutions for Outdoor Electronics, Sep. 17-19, 2007, 6 pages.
Scott, Cooling of Electronic Equipment, Apr. 4, 1947, 119 pages.
Sergent, Thermal Management Handbook for Electronic Assemblies, Aug. 14, 1998, 190 pages.
Steinberg, Cooling Techniques for Electronic Equipment First Edition, 1980, 255 pages.
Steinberg, Cooling Techniques for Electronic Equipment Second Edition, 1991, 299 pages.
Yeh, Thermal Management of Microelectronic Equipment, Oct. 15, 2002, 148 pages.
CIVIQ, Invalidity Claim Charts, Appendix F to H, Mar. 22, 2018, 18 pages.
Yung, Using Metal Core Printed Circuit Board as a Solution for Thermal Management article, 2007, 5 pages.
*Civiq Smartscapes LLC. V Manufacturing Resources International, Inc.*, Petition for Inter Partes Review of U.S. Pat. No. 8,854,572 including Declaration of Greg Blonder in Support of Petition, Curriculum Vitae of Greg Blonder and Prosecution History of U.S. Pat. No. 8,854,572, Petition filed Mar. 14, 2018, 427 pages.
Anandan, Munismay, Progress of LED backlights for LCDs, 2008, 24 pages.

* cited by examiner

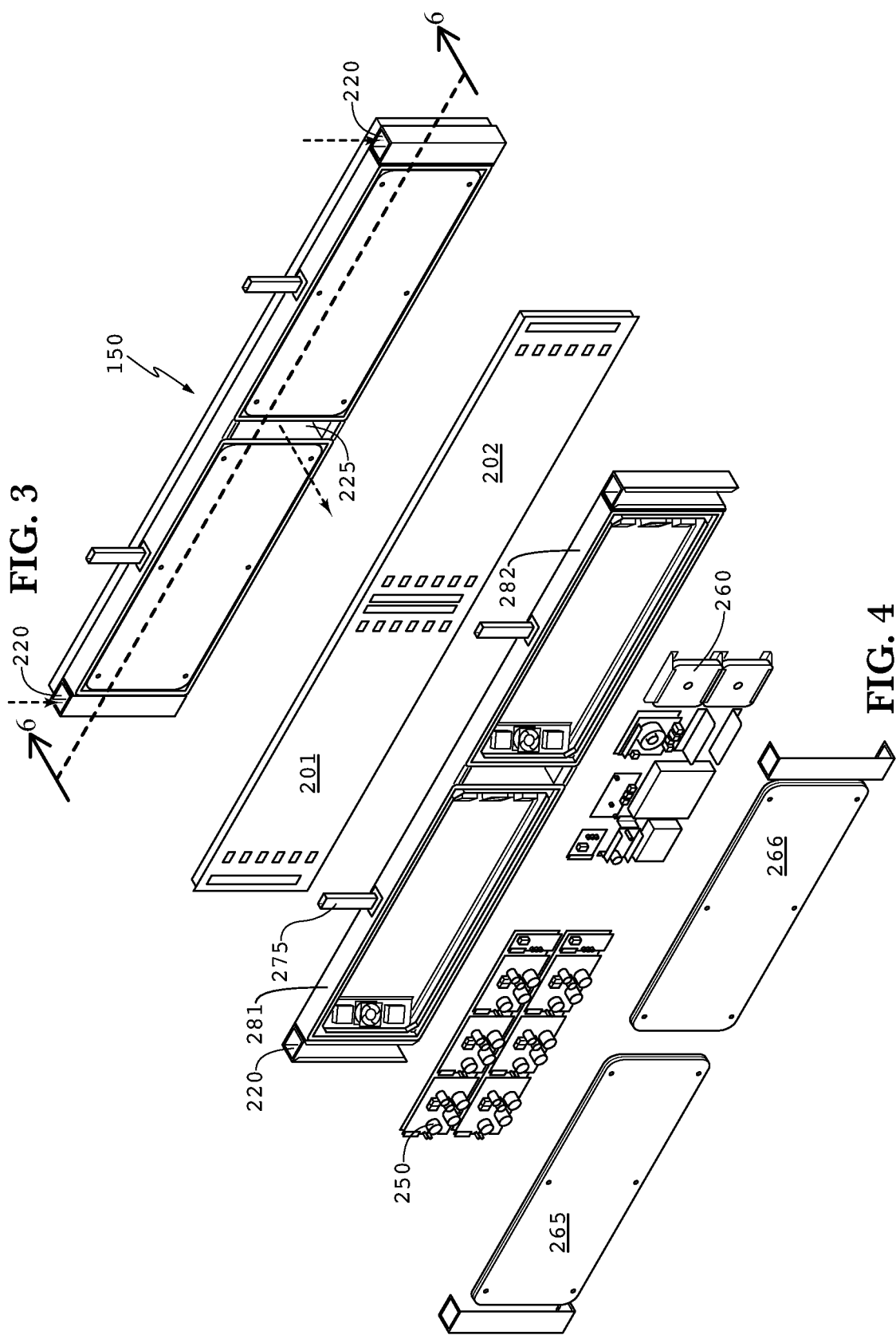

HEAT EXCHANGER ASSEMBLY FOR AN ELECTRONIC DISPLAY

CROSS-REFERENCE TO RELATED APPLICATIONS

This application claims priority to U.S. application Ser. No. 14/198,141 filed on Mar. 5, 2014, which claims the benefit of U.S. Provisional Application No. 61/791,421 filed on Mar. 15, 2013, both of which are hereby incorporated by reference as if fully recited herein.

TECHNICAL FIELD

The disclosed exemplary embodiments are directed to an assembly for removing heat generated by an electronic display.

BACKGROUND

Electronic displays are now being used in outdoor environments where high ambient temperatures and direct solar loading can cause the displays to malfunction due to excess heat.

SUMMARY

The exemplary embodiments disclosed herein provide a heat exchanger assembly for cooling power module bricks, having a plurality of heat exchanger layers where a top layer is in conductive thermal communication with the power module brick. A series of metallic plates are preferably positioned within some or all of the spaces between heat exchanger layers and are preferably aligned with the power module brick. A circulating fan may be positioned to force circulating gas across the power module brick and through the heat exchanger. An external air fan may be positioned to force external air through the heat exchanger. Pass through junctions may be positioned near edges of the heat exchanger to permit the circulating gas to cross paths with the external air without allowing the two gas flows to mix with one another.

This and other unmet advantages are provided by the assemblies and methods described and shown in more detail below.

BRIEF DESCRIPTION OF THE DRAWINGS

A better understanding of the disclosed embodiments will be obtained from a reading of the following detailed description and the set of accompanying drawings, wherein:

FIG. 3 is a perspective view of the electronics and power subassembly after being removed from the assembly shown in FIG. 1;

FIG. 4 is an exploded view of the electronics and power subassembly shown in FIG. 3;

DETAILED DESCRIPTION OF THE EXEMPLARY EMBODIMENTS

Figure 2:
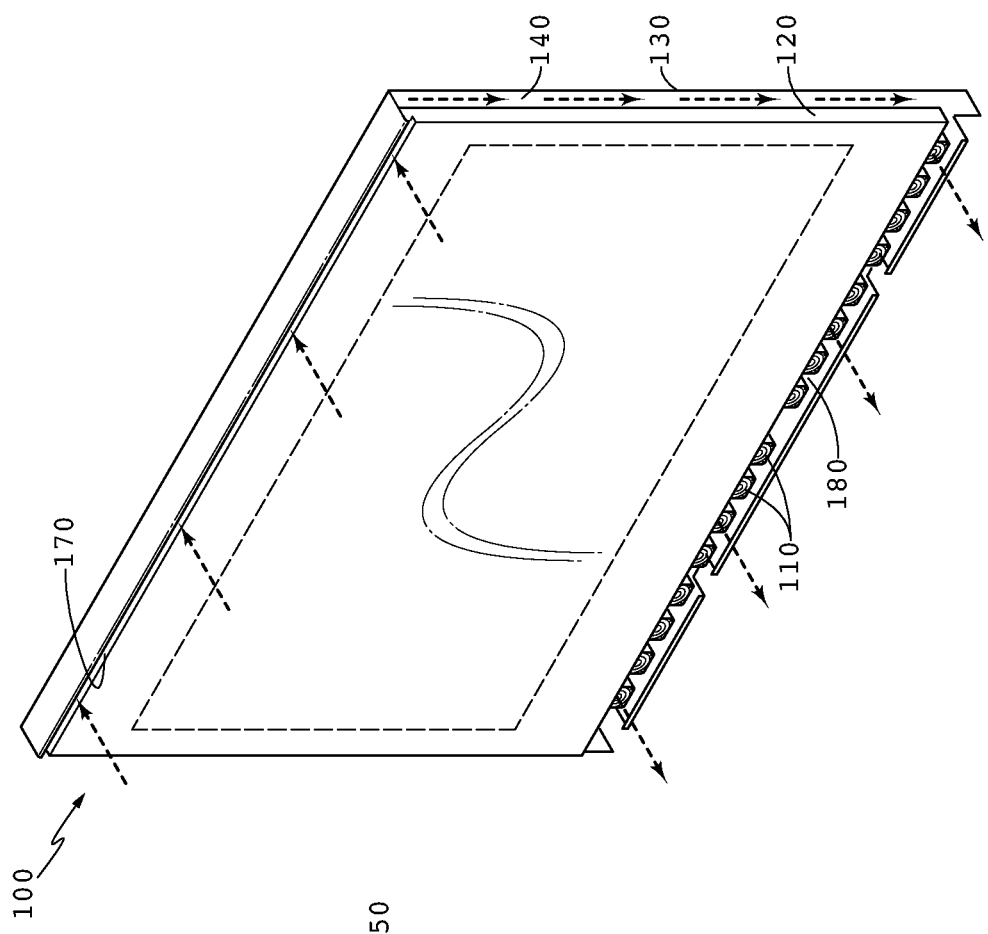
FIG. 2 is a perspective view of the electronic display subassembly after being removed from the assembly shown in FIG. 1.

The general inventive concept is described more fully hereinafter with reference to the accompanying drawings, in which exemplary embodiments of the invention are shown. This invention may, however, be embodied in many different forms and should not be construed as limited to the exemplary embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on" another element or layer, the element or layer can be directly on another element or layer or intervening elements or layers. In contrast, when an element is referred to as being "directly on" another element or layer, there are no intervening elements or layers present. Like numbers refer to like elements throughout. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "lower", "upper" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "lower" relative to other elements or features would then be oriented "upper" relative the other elements or features. Thus, the exemplary term "lower" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
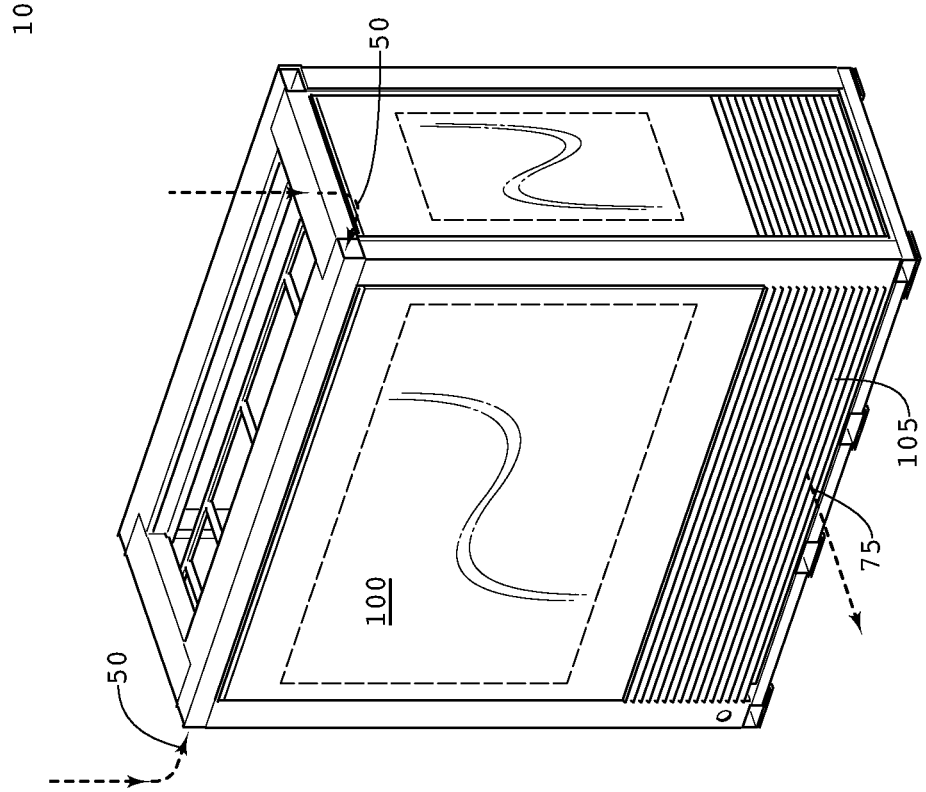
FIG. 1 is a perspective view of an exemplary electronic display assembly.

FIG. 1 is a perspective view of an exemplary electronic display assembly having a housing containing an electronic display subassembly 100 and an electronics and power subassembly 150. In an exemplary embodiment, the housing would have two separate flows of external air flowing through the housing. The first is shown in this figure where external air is ingested at the apertures 50 and is exhausted from the aperture 75.

FIG. 2 is a perspective view of the electronic display subassembly 100 after being removed from the assembly shown in FIG. 1. The electronic display 120 preferably has a pathway for external air running behind the display 120, this would provide the second flow of external air for an exemplary embodiment. In an exemplary embodiment, the inlet apertures 170 are positioned above the display and are in gaseous communication with a gap 140 behind the display, which ultimately connects with an exhaust aperture 180 positioned below the display. The gap 140 may be created by placing a surface or plate behind the rear surface of the electronic display 120. One or more fans 110 may be positioned to draw the external air through the inlet 170, gap 140, and exhaust 180.

The electronic display can be any variety of electronic display 120, including but not limited to liquid crystal display (LCD), LED, OLED, plasma, electroluminescent polymers, field emission display, and laser video displays. In an exemplary embodiment the electronic display 120 would comprise an LED backlit LCD where the rear surface of the electronic display 120 would be the rear surface of the LED backlight.

FIG. 3 is a perspective view of the electronics and power subassembly 150 after being removed from the assembly shown in FIG. 1 and illustrates the horizontal section line 6-6. A pair of inlet apertures 220 are preferably in gaseous communication with the inlet apertures 50 in the housing to supply external air to the assembly. This ingested external air is preferably exhausted through the exhaust aperture 225, which aligns with the exhaust aperture 75 in the housing.

FIG. 4 is an exploded view of the electronics and power subassembly 150 shown in FIG. 3. A first plenum enclosure is preferably created by the plenum walls 281, heat exchanger 201, and front cover 265. A second plenum enclosure is preferably created by the plenum walls 282, heat exchanger 202, and front cover 266. One or more power assemblies or power modules 250 may be placed within the first plenum enclosure. One or more electronic assemblies 260 may be placed within the second plenum enclosure. In an exemplary embodiment, the two plenum enclosures are substantially sealed, and do not accept external air, dust, or other contaminates other than the flow of external air described herein (which preferably would not enter the plenum enclosures, but would only flow through the heat exchangers 201 and 202 as described below).

Further, in an exemplary embodiment, the power modules 250 would be considered high voltage/high power electronics while the electronic assemblies 260 would be considered low voltage/low power electronics and these would be isolated into their own respective plenums. Generally speaking, the electronic assemblies 260 would include, but would not be limited to: hard drives, video players, microprocessors, wireless/satellite antennas, and CPU's. A wiring conduit 275 may provide wiring access into the plenums but should be substantially sealed so as not to allow contaminates or external air to enter the plenum through the wiring conduit 275. The wiring conduit 275 may provide the electrical communication between the low power and high power electronics and also between the low/high power electronics and the electronic display 120.

Figure 5:
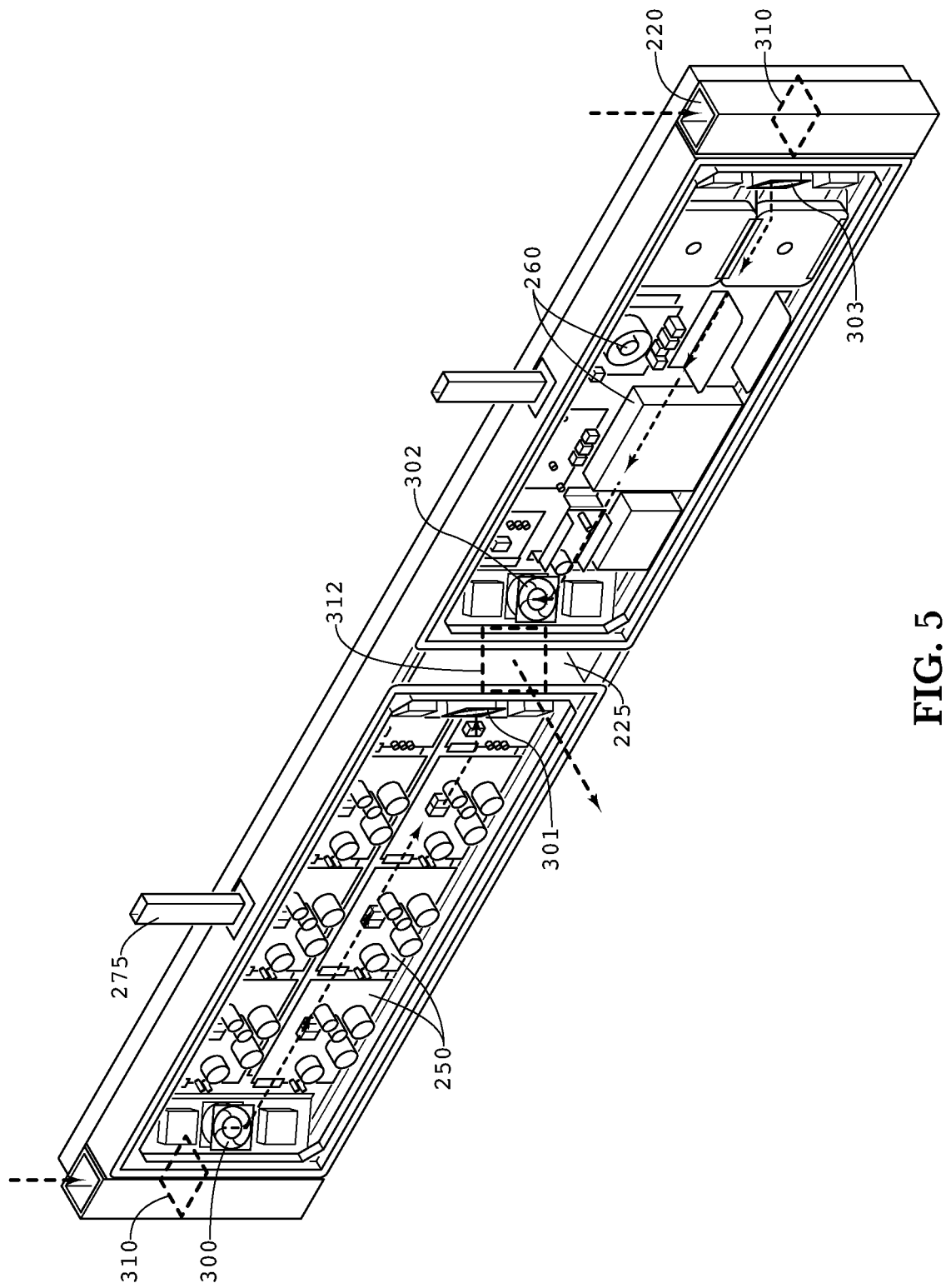
FIG. 5 is a perspective view of the electronics and power subassembly shown in FIG. 3 after cover door removal.

FIG. 5 is a perspective view of the electronics and power subassembly shown in FIG. 3 after removing the cover doors 265 and 266. A fan 310 may be placed in the inlet tube to draw the external air through the inlets, heat exchanger, and exhaust aperture 225. Alternatively, a fan 312 could be placed near the exhaust aperture 225. In some embodiments, both fans 310 and fan 312 may be used. In the first plenum, fans 300 and 301 are used to force a closed loop circulating gas through the plenum and heat exchanger 201. In the second plenum, fans 302 and 303 are used to force a closed loop circulating gas through the plenum and heat exchanger 202. Of course, in some embodiments only a single fan for each closed loop of circulating gas may be used rather than the pairing of fans shown herein.

Figure 6:
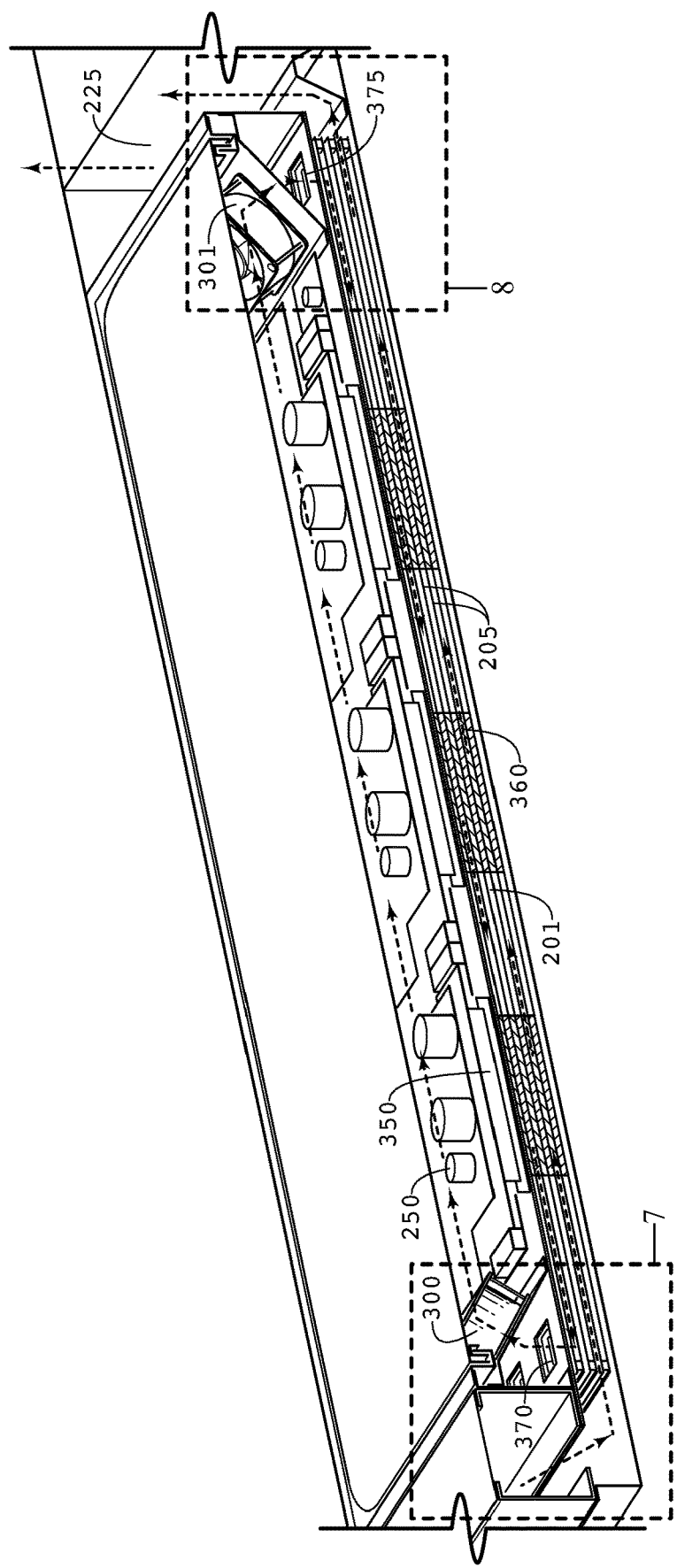
FIG. 6 is a section view of the electronics and power subassembly shown in FIG. 3, taken along section line 6-6 shown therein.

FIG. 6 is a section view of the electronics and power subassembly 150 shown in FIG. 3, taken along the section line 6-6. Each power module 250 is preferably placed in conductive thermal communication with the heat exchanger 201. In an exemplary embodiment, the power brick 350 is preferably in conductive thermal communication with the heat exchanger 201, which is comprised of a plurality of layers 205, where the space in between each layer defines a gaseous pathway. In an exemplary embodiment, a metallic plate 360 is preferably placed between each layer 205 of the heat exchanger 201, and is positioned adjacent to the areas containing a power brick 350. The layers 205 of the heat exchanger 201 may be metallic or plastic (sometimes corrugated plastic or corrugated metal as shown in the Figures) or any combination of these materials. The heat exchangers 201 and 202 are preferably counterflow heat exchangers.

In an exemplary embodiment, the length and width of the metallic plates 360 are substantially the same as the length and width of the power bricks 350, however this is not required. Ideally, a series of metallic plates 360 may be aligned with each brick 350, such that a layer 205 of the heat exchanger is placed between the brick 350 and the first plate 360, as well as between each subsequent plate 360. While it may not be necessary to place a metallic plate 360 between every heat exchanger layer 205, this may be done in an exemplary embodiment. Each metallic plate 360 may be sandwiched between the layers 205 and may be held in place with adhesive.

The external air is forced through the heat exchanger 201 and exhausted out of the exhaust aperture 225. In this way, heat from the power module 250 may be transferred to the brick 350 and eventually to the plates 360 and heat exchanger layers 205 through conductive heat transfer. The external air removes heat from these assemblies as it passes through the heat exchanger 201.

Additionally, closed loop circulating gas is also travelling through the pathways of the heat exchanger 201, where the gas pathways may be defined as the space between heat exchanger layers 205. The layers 205 may be space apart based on the thickness of the plates 360, and held with this spacing once assembled around the plates 360. In this embodiment, the closed loop of circulating gas is forced around the closed loop by the pair of fans 300 and 301. The loop may be described as beginning at fan 301, traversing the pass through junction 375, travelling through the heat exchanger 201, traversing the pass through junction 370, passing the fan 300, and travelling across the power modules 250 before returning to the fan 301. The gas pathways alternate, where a pathway accepting circulating gas would be adjacent to a pathway accepting external air which is in turn adjacent to another pathway accepting circulating gas. Preferably, the circulating gas and external air are not permitted to mix with one another. However, as the two gases travel through their pathways, heat from the circulating gas can be transferred to the external air and removed from the display housing through the exhaust.

The opposing heat exchanger 202 is setup in a similar fashion as the heat exchanger 201 described above. The only difference would be that heat exchanger 202 would not contain the bricks 350, which are generally not used for the low power/voltage electronics 260. However, the metallic plates 360 may be used in the heat exchanger 202, in order to pull heat from the electronics 260 into the heat exchanger 202 for removal by the external air.

Figure 7:
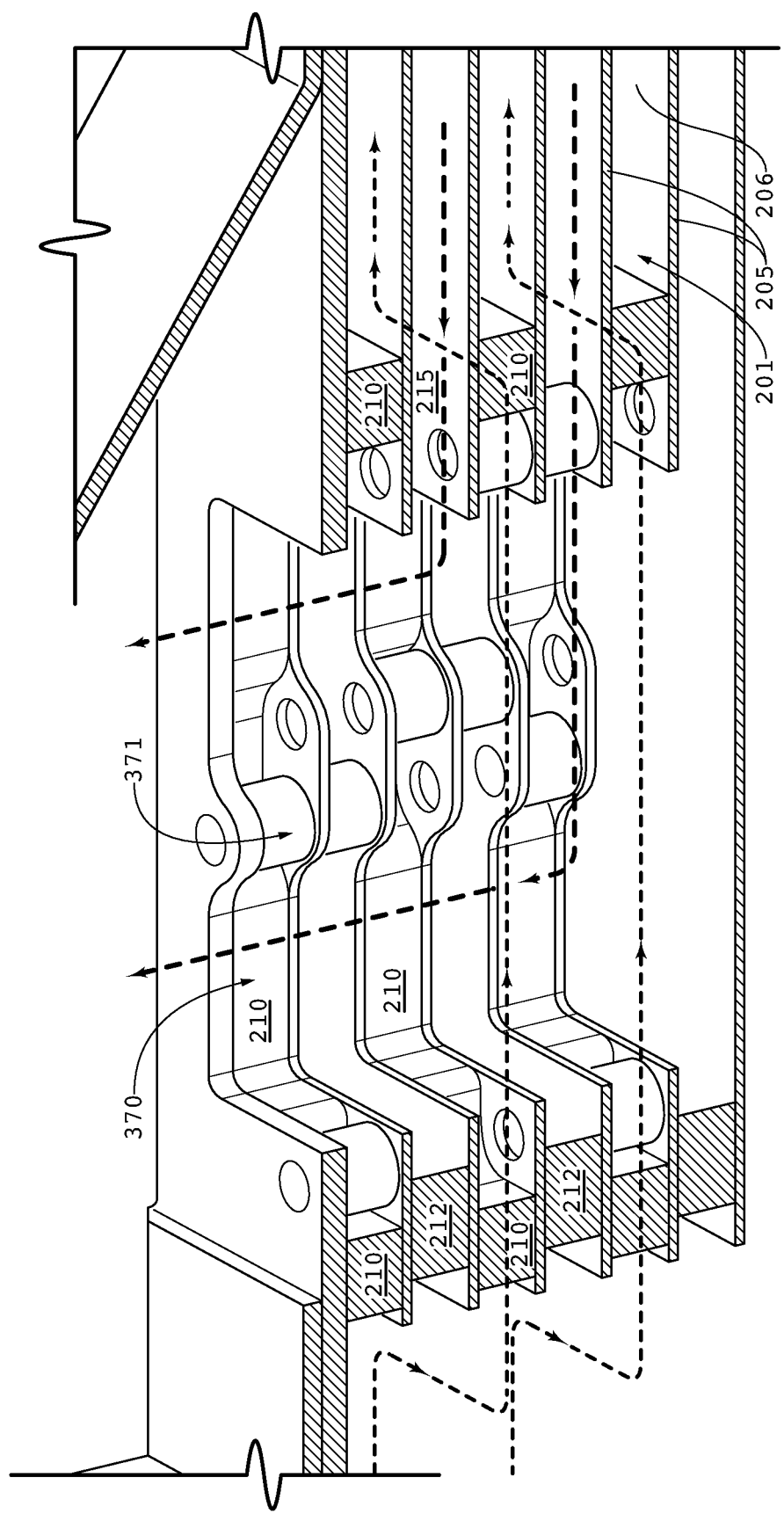
FIG. 7 is a detailed section view of DETAIL 7 shown in FIG. 6, where a second section has been taken vertically through the center of pass through junctions of the heat exchanger.

FIG. 7 is a detailed section view of DETAIL 7, shown in FIG. 6, where a second section has been taken vertically through the center of the pass through junctions. Here, the details of an exemplary pass through junction 370 are shown. Generally, the pass through junction 370 is placed near the end of the heat exchanger 201. Initially, note the blocking elements 212 which are positioned within each pathway 206 which contains the closed loop circulating gas. These blocking elements 212 run the entire length of the heat exchanger 201, to prohibit external air from entering the circulating gas pathways. Also note the cutout opening 371 in the heat exchanger which preferably passes through several, if not every layer 205 of the heat exchanger. While a blocking element 212 may be placed adjacent to the opening 371 on the end of the heat exchanger, the opposing side of the opening 371 is preferably free of any blocking so that the pathways 215 which accept circulating gas can provide gaseous communication through the opening 371 to continue the circulating closed loop path.

A series of donut gaskets 210 may be placed within each pathway 206 which accepts external air, such that the donut gasket 210 substantially surrounds and seals off the pathway 206 from the opening 371. In this way, external air traveling through the heat exchanger is permitted to flow through the pathway 206, but is not permitted to enter the opening 371 or mix with the circulating gas. The donut gaskets 210 do not preferably run the entire length of the heat exchanger, but would only surround the openings 371, which could be any shape but are typically found as rectangles, squares, circles, ovals, or some combination of these. The interior dimensions of the donut gaskets 210 preferable match that of the cutout 371. However, the exterior dimensions of the donut gaskets 210 can vary.

Although not required, it is preferable that the donut gaskets 210 are comprised of a compressible material, preferably an elastomer or rubber of some type, but soft and compressible materials have been found to provide acceptable results. In some embodiments, the donut gaskets 210 can simply comprise a sheet of compressible material having a void removed from the center, where that void can have any shape, including but not limited to any polygon, circle, or oval shape. Preferably, the donut gaskets 210 would have a continuous perimeter surrounding the void, which is preferably aligned with the opening 371, so that external air is not permitted to enter the opening 371, but can still travel through the pathway 206.

Figure 8:
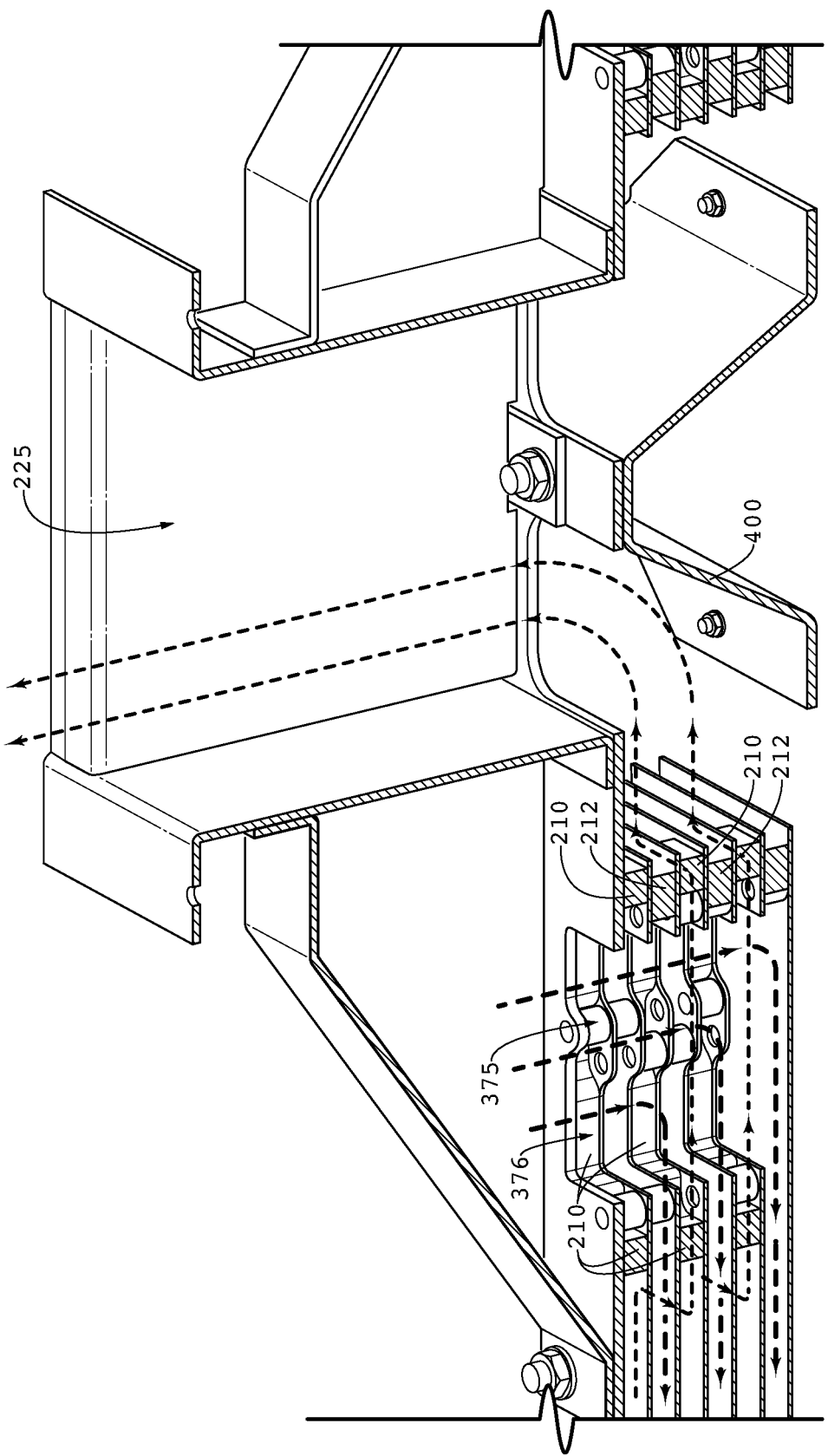
FIG. 8 is a detailed section view of DETAIL 8 shown in FIG. 6, where a second section has been taken vertically through the center of the pass through junctions.

FIG. 8 is a detailed section view of DETAIL 8, shown in FIG. 6, where a second section has been taken vertically through the center of the pass through junctions. Here, the details of an exemplary opposing pass through junction 375 are shown. Again, the opposing pass through junction 375 is preferably placed near the end/edge of the heat exchanger 201. Also, again note the blocking elements 212 which are positioned within each pathway 206 which contains the closed loop circulating gas. These blocking elements 212 run the entire length of the heat exchanger 201, to prohibit external air from entering the circulating gas pathways. Also note the cutout opening 376 in the heat exchanger which preferably passes through several, if not every layer 205 of the heat exchanger. While a blocking element 212 may be placed adjacent to the opening 376 on the end of the heat exchanger, the opposing side of the opening 376 is preferably free of any blocking so that the pathways 206 which accept circulating gas can provide gaseous communication through the opening 376 to continue the circulating closed loop path.

A series of donut gaskets 210 may again be placed within each pathway 206 which accepts external air, such that the donut gasket 210 substantially surrounds and seals off the pathway 206 from the opening 376. In this way, external air traveling through the heat exchanger is permitted to flow through the pathway 206, but is not permitted to enter the opening 376 or mix with the circulating gas. Here, the external air would travel around the donut gasket 210, eventually exiting the heat exchanger and exhausting out of the exhaust aperture 225.

An angled redirection plate 400 is preferably placed after the heat exchanger and adjacent to the exhaust aperture 225 in order to change the direction of the external air approximately 90 degrees, or in other words to direct it towards the exhaust aperture 225.

Another pair of pass through junctions with their own gasket donuts and blocking elements are preferably used for the opposing side of the assembly, which houses the electronics 260. The design could be substantially the same, however in some embodiments it may be possible to use a smaller heat exchanger or perhaps one with fewer layers, as there may be less heat generated by the electronics 260 when compared to the power modules 250. There could also be fewer fans used on this side of the assembly as well.

It should be noted that the term circulating gas does not require a 'pure' gas but could be any gaseous matter (which could of course be a mixture of various types of gases and even small amounts of contaminate, but the circulating gas would preferably have only a minimal amount of contaminates, and most preferably would be free of particulate and contaminates).

Having shown and described exemplary embodiments of the general inventive concept, those skilled in the art will realize that many variations and modifications may be made to affect the described embodiments and still fall within the scope of the general inventive concept. Thus, many of the elements indicated above may be altered or replaced by different elements which will provide the same result and fall within the spirit of the general inventive concept. It is the intention, therefore, to limit the general inventive concept only as indicated by the following claims.

What is claimed is:

1. A heat exchanger assembly for cooling a power module having a brick, the assembly comprising:
   a plurality of thermally conductive heat exchanger layers arranged with spaces therebetween, the spaces between certain heat exchanger layers configured to convey only external air and the spaces between certain other heat exchanger layers configured to convey only circulating gas;
   blocking elements residing within the circulating gas conveying spaces of the heat exchanger to define closed loop pathways, the blocking elements located along opposing edges of the heat exchanger;
   a top heat exchanger layer placed in conductive thermal communication with the power module brick; and
   a metallic plate located within each of the spaces between heat exchanger layers and aligned with the power module brick to form a conductive heat path from the power module brick through the heat exchanger layers;
   wherein the external air pathway through the heat exchanger is configured to promote the convective removal of heat that has been conductively transferred from the power module brick to the heat exchanger layers and the metallic plates.

2. The heat exchanger assembly of claim 1, further comprising a fan positioned to force external air through the respective external air conveying spaces between heat exchanger layers.

3. The heat exchanger assembly of claim 1, wherein the metallic plates are sandwiched between respective layers of the heat exchanger and held in place with adhesive.

4. The heat exchanger assembly of claim 1, further comprising:
   a cutout located near the opposed edges of the heat exchanger;
   a gasket surrounding each cutout in the external air conveying heat exchanger spaces; and
   a closed loop fan positioned to force a closed loop of circulating gas through the circulating gas conveying spaces of the heat exchanger, both cutouts, and along the power module.

5. The heat exchanger assembly of claim 4, wherein the blocking elements run the entire length of the heat exchanger.

6. The heat exchanger of claim 4, wherein the heat exchanger spaces configured to convey external air are isolated from the heat exchanger spaces configured to convey circulating gas.

7. The heat exchanger of claim 1, wherein the metallic plates have a length and width that is substantially the same as the length and width of the power module brick.

8. The heat exchanger of claim 1, wherein the metallic plates are substantially the same length and width as the power module brick.

9. The heat exchanger of claim 1, wherein the metallic plates and the heat exchanger layers cooperate to form a substantially solid and thermally conductive mass beneath the power module brick.

10. A heat exchanger assembly for cooling discrete power modules, each power module having a brick, the assembly comprising:
    a number of fixed but separate and thermally conductive heat exchanger layers arranged with spaces therebetween, an outer heat exchanger layer placed in conductive thermal communication with the power module bricks;
    a number of separate gas pathways defined by the spaces between heat exchanger layers, some of the gas pathways being external air pathways that are configured to convey air from outside of the heat exchanger and some of the gas pathways being circulating gas pathways that are configured to convey a closed loop circulating gas;
    blocking elements residing within the circulating gas conveying spaces of the heat exchanger to define closed loop pathways, the blocking elements located along opposing edges of the heat exchanger;
    metallic plates sandwiched between heat exchanger layers in each of the gas pathways, a number of the metallic plates aligned with each of the power module bricks to form a conductive heat path from each of the power module bricks through the heat exchanger layers;
    an external air fan positioned to force external air through the external air pathways, the external air pathways configured to direct the external air over the metallic plates and to promote the convective removal of heat that has been conductively transferred from the power module bricks to the metallic plates and the heat exchanger layers; and
    a circulating gas fan positioned to force circulating gas through the circulating gas pathways.

11. The heat exchanger assembly of claim 10, wherein the metallic plates and the heat exchanger layers cooperate to form a substantially solid and thermally conductive mass beneath each power module brick.

12. The heat exchanger assembly of claim 10, further comprising a pass through opening located near each end of the heat exchanger.

13. The heat exchanger assembly of claim 12, further comprising a gasket surrounding the pass through opening in each external air pathway;
    whereby external air traveling through the external air pathways will be isolated from circulating gas passing through the circulating gas pathways and the pass through openings.

14. The heat exchanger assembly of claim 13, further comprising an exhaust aperture in communication with the external air pathways but not the circulating gas pathways.

15. The heat exchanger assembly of claim 10, wherein each of the metallic plates is substantially the same length and width as the power module brick with which it is aligned.

16. A heat exchanger assembly for cooling power modules having bricks, the assembly comprising:
    a number of fixed but separate heat exchanger layers arranged with spaces therebetween, an outer heat exchanger layer placed in conductive thermal communication with the power module bricks;
    a number of separate gas pathways defined by the spaces between heat exchanger layers, some of the gas pathways being external air pathways that are configured to convey air from outside of the heat exchanger and some of the gas pathways being circulating gas pathways that are configured to convey a closed loop circulating gas;
    a metallic plate located within each of the gas pathways and in alignment with the power module bricks;

pass through openings traversing the heat exchanger layers and located near opposite ends of the heat exchanger;

a gasket surrounding the pass through opening in each external air pathway;

blocking elements placed along opposing edges of the heat exchanger within the circulating gas pathways;

an exhaust aperture in communication with the external air pathways but not the circulating gas pathways;

an external air fan positioned to force external air through the external air pathways and the exhaust aperture; and a circulating fan positioned to force circulating gas through the circulating gas pathways and across the power modules;

wherein external air traveling through the external air pathways will be isolated from circulating gas passing through the circulating gas pathways and the pass through openings.

17. The heat exchanger assembly of claim 16, wherein the heat exchanger layers are comprised of a material selected from the group consisting of corrugated plastic and metal.

18. The heat exchanger assembly of claim 16, wherein the heat exchanger is of counterflow design.

19. The heat exchanger assembly of claim 16, wherein the external air pathways and the circulating gas pathways are arranged in an alternating pattern.

20. The heat exchanger assembly of claim 16, wherein the heat exchanger layers are located within an enclosure along with the power modules.

* * * * *